(12) United States Patent
Cheng

(10) Patent No.: US 8,008,579 B2
(45) Date of Patent: Aug. 30, 2011

(54) PRINTED CIRCUIT BOARD PROVIDING HEAT DISSIPATION

(75) Inventor: Ming-Chun Cheng, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 374 days.

(21) Appl. No.: 12/193,777

(22) Filed: Aug. 19, 2008

(65) Prior Publication Data

US 2009/0294154 A1 Dec. 3, 2009

(30) Foreign Application Priority Data

Jun. 2, 2008 (CN) .......................... 2008 1 0301933

(51) Int. Cl.
*H05K 1/00* (2006.01)
(52) U.S. Cl. ........................................ 174/252; 361/777
(58) Field of Classification Search .................. 361/777; 174/252
See application file for complete search history.

(56) References Cited

U.S. PATENT DOCUMENTS

| | | | |
|---|---|---|---|
| 5,930,117 A * | 7/1999 | Gengel | 361/720 |
| 6,621,705 B1 * | 9/2003 | Ballenger et al. | 361/719 |
| 6,930,885 B2 * | 8/2005 | Barcley | 361/719 |
| 2004/0216917 A1 * | 11/2004 | Amir et al. | 174/257 |
| 2005/0039944 A1 * | 2/2005 | Kim et al. | 174/250 |

FOREIGN PATENT DOCUMENTS

| CN | 2603595 Y | 2/2004 |
|---|---|---|
| CN | 2927605 Y | 7/2007 |

* cited by examiner

*Primary Examiner* — Yuriy Semenenko
(74) *Attorney, Agent, or Firm* — Altis Law Group, Inc.

(57) ABSTRACT

A printed circuit board includes an insulated base sheet, a heat-conducting layer, and a plurality of heat-conducting blocks. The heat-conducting layer is disposed on the insulated base sheet. The heat-conducting blocks are formed on the heat-conducting layer. Each of the heat-conducting blocks is separated from each other.

11 Claims, 3 Drawing Sheets

PRINTED CIRCUIT BOARD PROVIDING HEAT DISSIPATION

BACKGROUND

1. Field of the Invention

The present invention generally relates to printed circuit boards, and particularly, to a printed circuit board providing heat dissipation.

2. Discussion of the Related Art

Printed circuit boards (PCB) are commonly employed as a base or carrier for circuit elements such as microprocessor chips, power die transistors, semiconductors and other circuit components. Presently, many electronic assemblies require small volume, with the PCB requiring the same, such that circuit elements must be densely assembled thereon. As a result, heat produced by the circuit elements is accumulated on the PCB, presenting difficulty in the dissipation thereof. Thus, the circuit elements have an unduly short functional lifespan. Such PCBs generally incorporate a system for heat dissipation, such as a heat dissipation hole defined in the PCB, a metallic layer formed on the PCB, a metallic sheet attached to a rear portion of the PCB, or a layer of thermal grease.

A typical PCB includes an insulated sheet, copper foil formed on the sheet, and a solder mask partially coating the copper foil. Areas of the copper foil not coated with solder mask form a plurality of cross-shaped copper zones. When the PCB is placed into a tin stove, tin alloy is formed on the copper zones in corresponding cross-shaped tin strips, providing heat dissipation. However, the tin strips occupy a relatively large area, occupying valuable footprint space, and, in fact, if circuit elements need to be densely mounted on the PCB, there will be not enough room for formation of the tin strips. Accordingly, the tin strips offer only limited efficacious benefit.

Therefore, a printed circuit board providing heat dissipation is desired to overcome the described limitations.

SUMMARY

A printed circuit board includes an insulated base sheet, a heat-conducting layer, and a plurality of heat-conducting blocks. The heat-conducting layer is disposed on the insulated base sheet. The heat-conducting blocks are mounted on the heat-conducting layer. The heat-conducting blocks are separated from each other.

Other advantages and novel features will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of a printed circuit board providing heat dissipation. Moreover, in the drawings, like reference numerals designate corresponding parts throughout the several views.

DETAILED DESCRIPTION OF THE EMBODIMENTS

Reference will now be made to the drawings to describe embodiments of the printed circuit board in detail.

Figure 1:
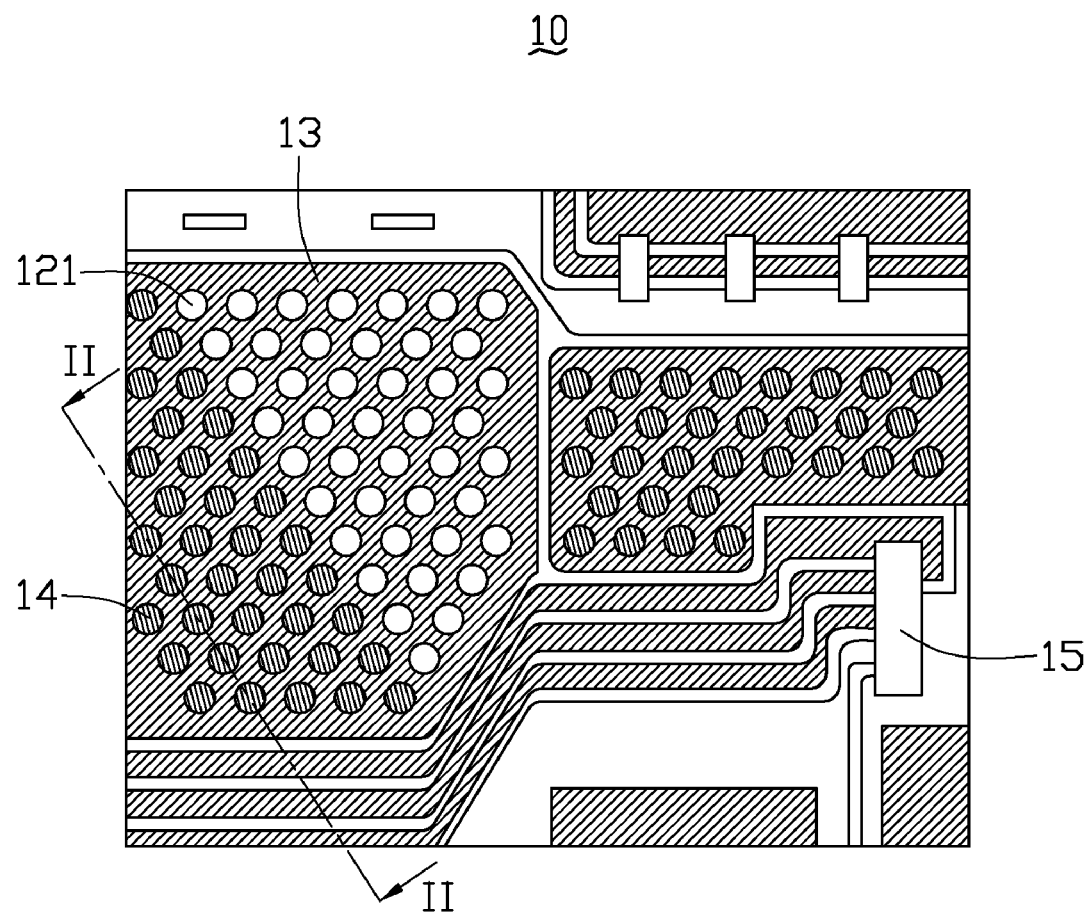
FIG. 1 is a top plan view of one side of a first exemplary embodiment of a printed circuit board providing heat dissipation.
Figure 2:
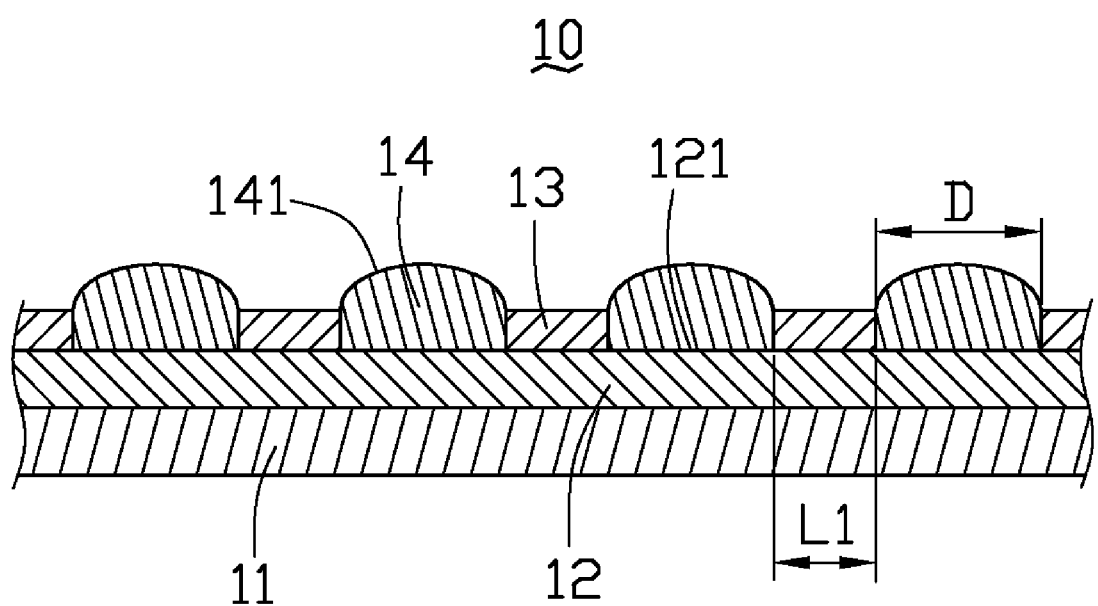
FIG. 2 is a partial cross-section of the printed circuit board of FIG. 1, taken along the line II-II thereof.

Referring to FIGS. 1 and 2, a printed circuit board 10 of a first embodiment includes an insulated base sheet 11, a heat-conducting layer 12, an insulated layer 13, a plurality of separate heat-conducting blocks 14, and a plurality of bonding pads 15. The insulated base sheet 11 is glass-filled epoxy, Kevlar, or phenolic resin. The heat-conducting layer 12 is preferably a copper foil formed on the insulated base sheet 11. It is to be noted that the heat-conducting layer 12 can also be aluminum foil or other heat-conducting metallic material. The insulated layer 13 is a solder mask partially coated on the heat-conducting layer 12. The heat-conducting blocks 14 on the heat-conducting layer and preferably tin alloy. The bonding pads 15 are disposed on the heat-conducting layer 12 for soldering circuit elements.

In a method for fabricating the heat-conducting blocks 14, insulated layer 13 is coated on a surface of heat-conducting layer 12, covering it completely. A portion of the insulated layer 13 is removed from the heat-conducting layer 12, creating a plurality of exposed zones 121 thereon. The exposed zones 121 are metallic surfaces. In a tin stove, tin alloy is coated on the exposed zones 121 to form a plurality of solid heat-conducting blocks 14 for heat dissipation. The exposed zones 121 are separated and can be circular, elliptical, or polygonal, preferably circular and of uniform radius. Each of the heat-conducting blocks 14 preferably extends out of the insulated layer 13 and includes a spherical top portion 141.

Separation of the bonding pads 15 by relatively large spaces results in a correspondingly large empty surface on the insulated layer 13. The heat-conducting blocks 14 are arrayed regularly on the empty surface. The size of each exposed zone 121 affects the rate of heat dissipation. If each exposed zone 121 is too small, heat-conducting blocks 14 formed thereon will be too small to optimize the effect of heat dissipation. If the exposed zone 121 is too large, the number of heat-conducting blocks 14 formed on the printed circuit board 10 will be decreased, thereby weakening the effect of heat dissipation. When exposed zones 121 are circular, the radius D of each exposed zone 121 should preferably be from about 1.2 to 2.0 millimeters (mm). In the first embodiment, the radius D of each exposed zone 121 is 1.6 mm. Each of the heat-conducting blocks 14 is separated from its adjacent heat-conducting block 14 at an interval L1 exceeding about 0.5 mm.

Figure 3:
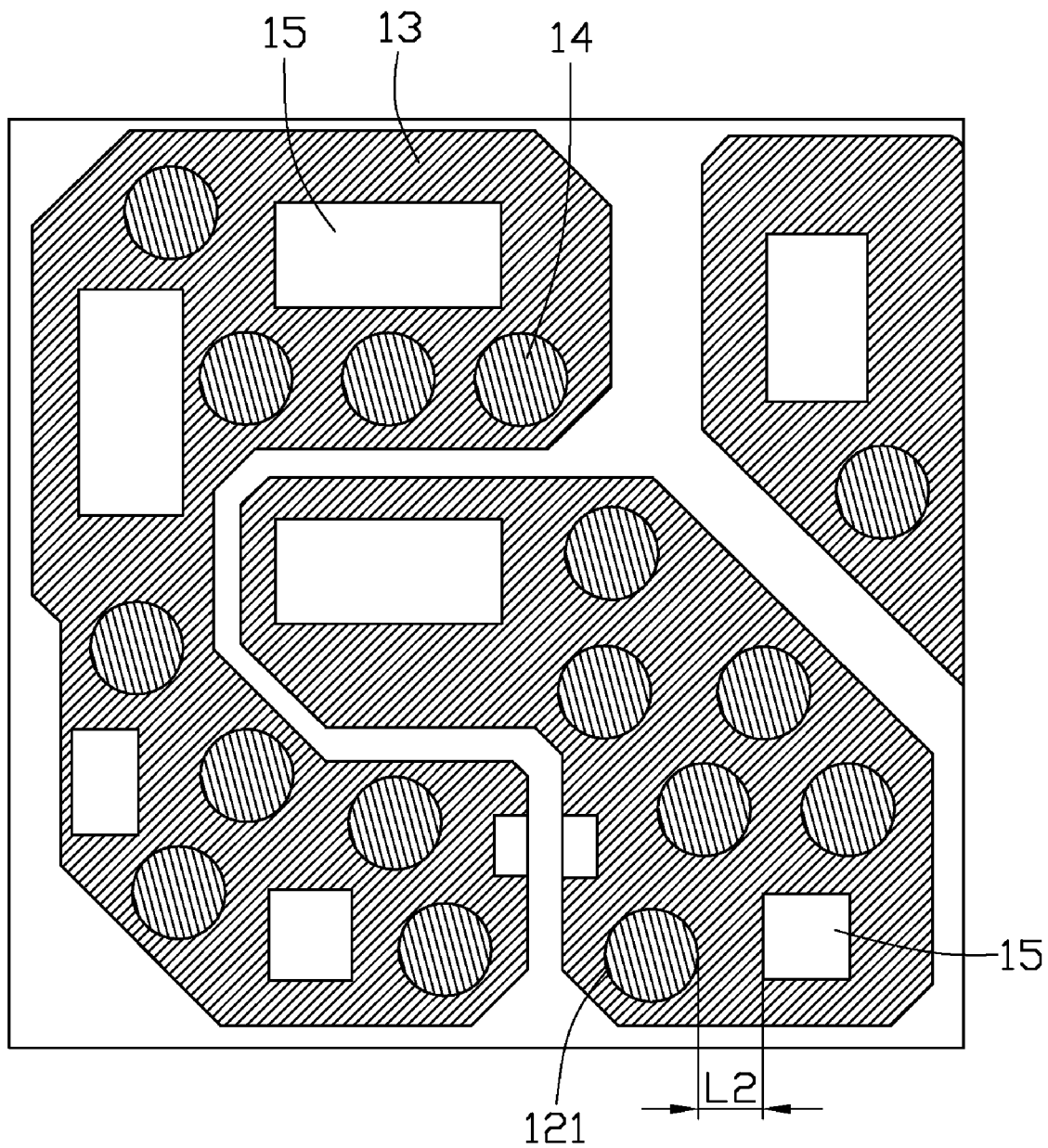
FIG. 3 is an enlarged top plan view of one side of a second exemplary embodiment of a printed circuit board providing heat dissipation.

Referring to FIG. 3, in a second embodiment, the bonding pads 15 are densely positioned on the insulated layer 13, making it difficult to find a relatively large empty surface. The heat-conducting blocks 14 are positioned in empty areas of the insulated layer 13 adjacent to the bonding pads 15. To prevent solder such as tin alloy from inadvertently contacting the bonding pads 15, a minimum distance L2 between an edge of each exposed zone 121 and an edge of its adjacent bonding pad 15 is preferably equal to or exceeding about 0.3 mm.

In use, heat produced by circuit elements is quickly transmitted by the heat-conducting layer 12 to the heat-conducting blocks 14 and the heat-conducting blocks 14 dissipate the heat, thus the printed circuit board 10 exhibits good heat dissipation. The heat-conducting blocks 14 can be positioned in empty areas of the insulated layer 13 adjacent to the bonding pads 15 and do not interfere with the layout of the printed circuit board 10, suiting them well for deployment on high density integrated PCBs.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A printed circuit board, comprising:
   an insulated base sheet;
   a heat-conducting layer disposed on the insulated base sheet;
   an insulated layer partially coated on the heat-conducting layer, leaving a plurality of exposed zones remaining thereon; and
   a plurality of circular heat-conducting blocks formed on the heat-conducting layer, each of the heat-conducting blocks being separated from each other, and the heat-conducting blocks being correspondingly arrayed on the exposed zones of the insulated layer.

2. The printed circuit board of claim 1, wherein all of the exposed zones have a same radius.

3. The printed circuit board of claim 2, wherein a radius of each exposed zone is from about 1.2 mm to about 2.0 mm.

4. The printed circuit board of claim 3, further comprising a plurality of bonding pads positioned on the heat-conducting layer for soldering circuit elements, wherein a minimum distance between an edge of each exposed zone and an edge of its adjacent bonding pad is equal to or exceeding about 0.3 mm.

5. The printed circuit board of claim 1, wherein each of the heat-conducting blocks extends out of the insulated layer and includes a spherical top portion.

6. The printed circuit board of claim 1, wherein each of the heat-conducting blocks is separated from its adjacent heat-conducting block by an interval exceeding 0.5 mm.

7. The printed circuit board of claim 1, wherein the insulated base sheet is glass-filled epoxy, Kevlar, or phenolic resin.

8. The printed circuit board of claim 1, wherein the heat-conducting layer is copper foil formed on the insulated base sheet.

9. The printed circuit board of claim 1, wherein the heat-conducting layer is aluminum foil formed on the insulated base sheet.

10. The printed circuit board of claim 1, wherein the heat-conducting blocks are tin alloy.

11. The printed circuit board of claim 1, wherein the insulated layer is solder mask.

* * * * *